United States Patent [19]

Law et al.

[11] Patent Number: 4,608,696

[45] Date of Patent: Aug. 26, 1986

[54] INTEGRATED LASER AND FIELD EFFECT TRANSISTOR

[75] Inventors: Hsiang-Yi D. Law, Agoura; Edward A. Rezek, Redondo Beach, both of Calif.

[73] Assignee: TRW Inc., Redondo Beach, Calif.

[21] Appl. No.: 506,684

[22] Filed: Jun. 22, 1983

Related U.S. Application Data

[63] Continuation of Ser. No. 502,073, Jun. 8, 1983, abandoned.

[51] Int. Cl.[4] .............................................. H01S 3/19
[52] U.S. Cl. ........................................ 372/50; 357/17; 357/41; 372/46
[58] Field of Search .................... 372/44, 45, 50, 46, 372/48; 357/41, 17

[56] References Cited

U.S. PATENT DOCUMENTS 4,352,116 9/1982 Yariv et al. ........................... 372/50

4,366,567 12/1982 Fukuzawa et al. .................. 372/50

FOREIGN PATENT DOCUMENTS 0117295 9/1980 Japan .................................... 372/50

Primary Examiner—James W. Davie
Attorney, Agent, or Firm—Noel F. Heal; Robert M. Wallace

[57] ABSTRACT

A monolithic device, including a substrate, a semiconductor laser formed in the substrate, and a metal-insulator-semiconductor field-effect transistor (MISFET) also formed in the substrate, in such a manner as to facilitate the use of planar fabrication techniques. In a first disclosed embodiment, the device is formed on an n+ substrate and the MISFET is operated in inversion mode. In a second embodiment, an n+ substrate is also employed, but the structure includes a semi-insulating layer to confine current-carrier flow in the MISFET, which is operated in depletion mode. In a third embodiment, a semi-insulating substrate is employed, and the laser is of the buried heterostructure type.

22 Claims, 11 Drawing Figures

INTEGRATED LASER AND FIELD EFFECT TRANSISTOR

This application is a continuation of copending prior application, Ser. No. 502,073, filed June 8, 1983, now abandoned, and entitled "Integrated Laser and Field Effect Transistor."

BACKGROUND OF THE INVENTION

The present invention relates generally to semiconductor lasers, and, more particularly, to devices in which one or more semiconductor lasers are integrated with electronic devices on a single substrate. Integration of optical and electronic components would ultimately reduce the manufacturing costs of devices such as laser light sources, detectors and repeaters for fiber optic communication systems. It is current practice to manufacture laser and electronic components as separate devices. The reason for this is that, although a laser and an electronic device may both be fabricated in semiconductor form, they have physical requirements that are incompatible in one important respect.

A semiconductor laser should ideally be fabricated on a substrate of relatively low resistivity, presenting a relatively low series resistance to the flow of current through the device. However, a low-resistivity substrate is contrary to the usual requirements of a field-effect transistor (FET), which is the transistor type best suited for integration with lasers on a large scale. The other major transistor type is the bipolar transistor, which poses significant electrical isolation problems when multiple devices are incorporated onto one substrate. U.S. Pat. No. 4,092,614 issued to Sakuma et al. discloses a semiconductor device including both a laser and bipolar transistor circuitry. However, the laser is not really integrated into the device. Instead it is mounted as a discrete component on a copper metalization layer over the transistor components.

Field-effect transistors, and in particular those of the same general type as the metal-insulator-semiconductor field-effect transistor (MISFET), do not suffer from the isolation problems of bipolar transistors, and lend themselves well to integration on a large scale. These devices use a relatively shallow surface layer for conduction of current. This is referred to as the active layer or the channel region of the device, or more typically as the n channel or the p channel, depending on the polarity of the current carriers in the channel. Ideally, the material beneath the channel is an insulating or semi-insulating substrate, to confine the current flow to the channel. This semi-insulating substrate is, of course, incompatible with the need for a relatively low-resistivity substrate for a semi-conductor laser.

One solution to this problem is to fabricate the laser as a mesa structure above a semi-insulating substrate, as suggested in U.S. Pat. No. 4,212,020 issued to Yariv et al. However, the height of the mesa interferes significantly with planar fabrication techniques. Masks used in fabrication cannot be as easily aligned on such a structure, and the precision of the manufacturing process is considerably reduced.

It will be appreciated from the foregoing that there is still a significant need for improvement in the area of integrated semiconductor lasers and electronic devices. In particular, the need is for a solution to the difficulties posed by the fabrication of semiconductor lasers and field-effect transistors on a semi-insulating substrate. The present invention fulfills this need.

SUMMARY OF THE INVENTION

The present invention resides in a novel combination of a semiconductor laser and a field-effect transistor, fabricated in integrated form on a single substrate. In its most general form, the invention comprises a substrate, a semiconductor laser formed on the substrate, and a metal-insulator-semiconductor field-effect transistor (MISFET) also formed on the substrate and having one electrical terminal in common with a terminal of the semiconductor laser. In all of the disclosed embodiments of the invention, the semiconductor laser is formed in such a position with respect to the MISFET as to facilitate use of planar fabrication techniques, to form other electronic and optical components on the same monolithic device. Specifically, the laser is formed at least in part below the level of the MISFET.

In a first embodiment of the device, the substrate is a Group III-V compound and is heavily doped with an impurity of a particular polarity type. A group III-V compound is one having at least one element selected from Group III of the periodic table and at least another selected from Group V of the periodic table. The device further includes a laser active layer of a Group III-V compound formed on the substrate, and a MISFET active layer of a Group III-V compound formed over the laser active layer and lightly doped with an impurity of the opposite polarity to that of the substrate. The semiconductor laser in this embodiment includes a diffused region formed in the MISFET active layer by selective diffusion of a material of the opposite polarity to that of the substrate, and an ohmic contact region formed over the diffused region. The MISFET includes source and drain regions formed over the MISFET active layer, one of the source and drain regions being electrically connected to the top ohmic contact region of the semiconductor laser, and an insulated gate terminal disposed between the source and drain regions. In this embodiment the MISFET is operated in the inversion mode.

More specifically, the first embodiment of the invention may, for example, be fabricated on an n+ substrate of indium phosphide (InP), over which is formed an n+ buffer layer of the same material. The laser active layer may be undoped indium gallium arsenide phosphide (InGaAsP), and the MISFET active layer is a p region of InP or InGaAs. The diffused region is a p+ region formed by the diffusion of zinc. If the doping polarities were reversed, the diffusion region would be formed as an n+ region by the diffusion of a different material, such as sulfur.

In a second embodiment of the device, the substrate is also a compound of elements selected from Groups III-V of the periodic table, and is heavily doped with an impurity of a particular polarity type. In this embodiment, the device further includes a laser active layer of a group III-V compound formed on the substrate, a MISFET active layer of a Group III-V compound formed over the laser active layer and doped with an impurity of the opposite polarity of the substrate, and a semi-insulating layer formed beneath the MISFET active layer, to confine current carrier flow in the MISFET active layer to a relatively shallow region of the layer. The semiconductor laser includes a diffused region extending down to the laser active layer and formed by selective diffusion of a material of the same polarity type as the laser active layer, and an ohmic contact region formed over the diffused region. The MISFET includes source and drain regions formed over the MISFET active layer, one of the source and drain regions being electrically connected to the ohmic contact region of the semiconductor laser, and an insulated gate terminal disposed between the source and drain regions. The MISFET in this embodiment is operated in the depletion mode.

More specifically the second embodiment is similar in some respects to the first embodiment, using an n+ substrate of InP. However, the MISFET includes an active layer of n-type InGaAs or InP, and this is formed over the semi-insulating layer, which may be of undoped InP, if the background level of impurity concentration is suitable, or may be doped with an impurity such as iron.

In a third embodiment of the invention, the substrate is of a semi-insulating compound of elements selected from Groups III-V of the periodic table. The semiconductor laser is of the buried heterostructure type and includes a first region of a Group III-V compound heavily doped with impurities of a selected polarity and extending into a well previously formed in the substrate, a second, undoped region formed over the first region and serving as an active layer for the laser, and a third region formed over the second region and being heavily doped with an impurity of the opposite polarity to the first region. In addition, there are a plurality of cladding layers laterally surrounding the second and third regions and a portion of the first region, and an ohmic contact region formed over the third region. The MISFET is operated in the depletion mode and includes a MISFET active layer formed over the substrate adjacent to the first region of the semiconductor laser, a drain region formed over the MISFET active layer, and an insulated gate terminal disposed between the source region and the first region of the laser, which also serves as a source region for the MISFET. The first region of the semiconductor laser, because of its relatively deep geometry, provides the laser with a desirably low series resistance.

More specifically, the third embodiment may be formed on a semi-insulating substrate of indium phosphide (InP), the first region of the laser being n+ InP, the active second region being undoped InGaAsP, and the third region being p+ InP. The cladding layers include a p-type layer, an n-type layer and another p-type layer, all of indium phosphide (inP). The junction between the first n-type cladding layer and the p-type layer is reverse biased and thereby precludes the flow of current through the junction. Thus, practically the entire current entering the ohmic contact of the laser is forced to flow through the active layer of the laser.

It will be appreciated from the foregoing that the present invention represents a significant advance in the field of integrated optoelectronics. In particular, the invention combines a semiconductor laser with an associated electronic device in the same monolithic device, without any of the disadvantages previously associated with this combination. Also, this method can be extended to integrate a laser with electronic circuits containing multiple FETs, diodes and resistors. Other aspects and advantages of the invention will become apparent from the following more detailed description.

DESCRIPTION OF THE PREFERRED EMBODIMENTS

Figure 1:
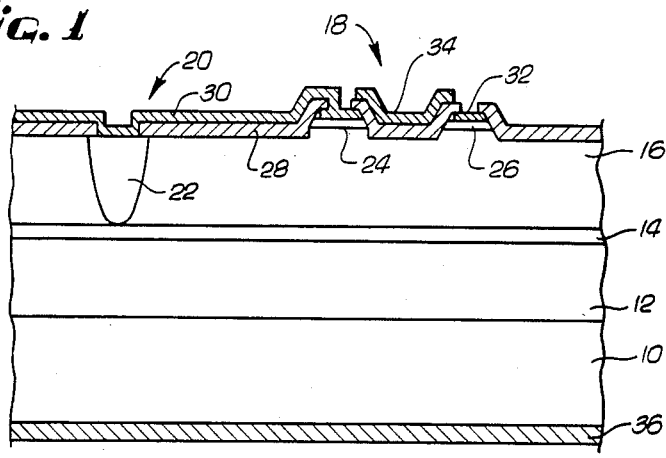
FIG. 1 is a fragmentary cross-sectional view of a monolithic device embodying the invention.

As shown in the drawings for purposes of illustration, the present invention is concerned with the integration of semiconductor lasers and electronic components on a single monolithic device. Although this has been suggested in the past, no completely satisfactory structure has been available prior to the present invention.

In accordance with the invention, a semiconductor laser and a metal-insulator-semiconductor field-effect transistor (MISFET) are formed on the same substrate and have one electrical terminal in common. In all of the disclosed embodiments of the invention, the semiconductor laser is formed at least in part below the level of the MISFET, thereby facilitating the use of planar fabrication techniques to form other electronic and optical components on the same monolithic device. Three embodiments of the invention are disclosed by way of illustration. In the first two embodiments to be described, the semiconductor laser and the MISFET are formed on an n+ substrate, while the third embodiment employs a semi-insulating substrate.

Figures 1A, 1B:
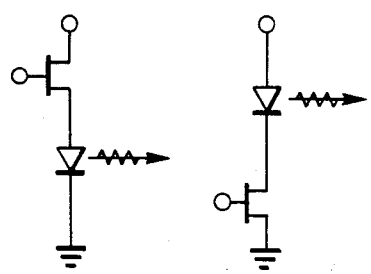
FIGS. 1a and 1b are schematic diagrams showing the combination of a semiconductor laser diode and a MISFET device.

As shown in FIGS. 1a and 1b, the combination of the invention is equivalent to a semiconductor laser diode, indicated by reference numeral 8, connected to a power supply (not shown) through the source and drain terminals of a MISFET 9. The MISFET 9 is referred to as the driver of the semiconductor laser 8, which receives a current that is determined by the bias applied to the gate terminal of the MISFET 9.

In the first embodiment of the invention, shown in FIG. 1, the device includes a substrate 10 of a heavily doped compound of elements of which at least one is selected from Groups III of the periodic table and another is selected from Group V. This is commonly referred to as a Group III-V compound. In this example, the substrate 10 is of n+ indium phosphide (InP) and the doping concentration is approximately $1 \times 10^{18}$ cm$^{-3}$. Formed over the substrate 10 is a thinner buffer layer 12 of the same material as the substrate. The buffer layer may be, for example, four microns thick. Formed over the buffer layer 12 is an undoped layer 14 of indium gallium arsenide phosphide (InGaAsP), having a thickness of only about 0.1 micron and having a background p-type concentration of approximately $1 \times 10^{17}$ cm$^{-3}$.

Successive layers in the devices described in this specification are formed by conventional techniques, which are not critical to the present invention and are therefore not described. Similarly, conventional photolithographic or other techniques are employed to define regions for processing by implantation, diffusion or metalization.

Formed above the undoped layer 14 is a p-type layer 16 of indium phosphide (InP), having a thickness of approximately two microns. As will shortly be seen, this layer 16 is the channel region for a metal-insulator-semiconductor field-effect transistor (MISFET) 18, and also serves as an optical cladding material for a semiconductor laser 20.

It will be understood that the polarity types of layers 12 and 16 may be reversed. Preferably, however, the buffer 12 is of an n-type material and the channel region 16 is p-type, as described above.

A material such as zinc, having the same polarity type as that of the channel region 16, is selectively diffused into the channel region to form a p+ region 22 extending to the undoped layer 14. The p+ region 22, the undoped layer 14 and the n+ buffer layer 12 together comprise the semiconductor laser 20, which, when forward-biased, emits coherent light from the active layer 14, in a direction normal to the plane through which the cross-sectional view is taken.

A source region 24 and a drain region 26 are formed above the p-type layer 16. The source and drain may be silicon-implanted n-type indium phosphide (InP). An insulating layer 28 of silicon dioxide (SiO$_2$) covers the p-type layer 16 except for openings at the diffused region 22 and at the source and drain regions 24 and 26. A source metalization layer 30 makes contact with the source 24 and with the diffused laser region 22. A drain metalization layer 32 contacts the drain region 26, and a gate metalization layer 34 located between the source 24 and drain 26 provides a gate terminal for the MISFET 18. Finally, an n+ ohmic contact layer 36 is applied to the underside of the substrate 10, and provides the common and usually grounded terminal of the device.

Figure 2:
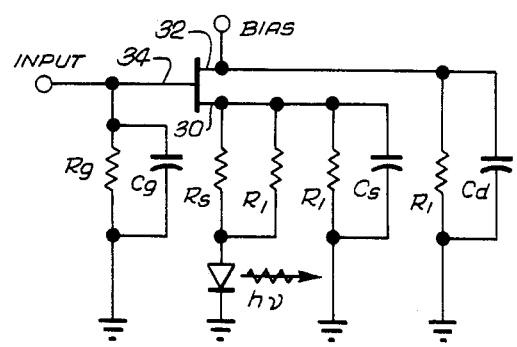
FIG. 2 is a schematic diagram showing the equivalent circuit of the device of FIG. 1.

FIG. 2 shows the equivalent circuit of the FIG. 1 device. The symbols in FIG. 2 have the following meanings:

$R_g$ = gate resistance,
$C_g$ = gate capacitance,
$R_S$ = series laser resistance
$R_1$ = reverse-junction resistance between drain or source and layer 16
$C_s$ = source capacitance, and
$C_d$ = drain capacitance.

It will be observed from FIG. 2 that there are parallel paths to ground from the gate terminal 34, through the gate resistance $R_g$ and the gate capacitance $C_g$. Likewise, there are parallel paths to ground from the drain terminal 32, through $R_1$ and $C_d$, and from the source terminal 30, through $R_1$ and $C_s$. Since the source terminal and one terminal of the laser 20 are connected in common, the equivalent circuit shows an additional path from the source terminal, through the laser resistance $R_S$ and $R_1$ in parallel, and through the laser, represented as a diode, to ground.

In operation of the device, a positive bias voltage is applied to the drain terminal 32 and an input modulation signal is applied to the gate terminal 34. When the gate voltage is zero, practically no current will flow through the device, since the junction between the drain and the underlying p-type layer 16 is effectively reverse-biased. When a sufficiently positive voltage is applied to the gate terminal 34, a surface inversion layer, or channel, is formed between the source and drain regions, and the device becomes conductive. In effect, the surface layer of the p-type layer 16 is inverted in polarity and becomes an n-type channel. This mode of FET operation, in which the device is "off" until a gate voltage is applied, is referred to as either inversion mode or enhancement mode.

Once the MISFET 18 becomes conductive, current will flow from the drain to the source, and then on through the semiconductor laser 20 to the underside ohmic contact layer 36, triggering operation of the laser. Normally, a high-resistivity substrate is desirable for an FET, to isolate the conductive channel of the device. However, high resistivity is not desirable from the standpoint of the semiconductor laser. The FIG. 1 embodiment of the invention overcomes this difficulty by combining a semiconductor laser with a MISFET operating in the inversion mode, on a substrate of relatively low resistivity.

Figure 3:
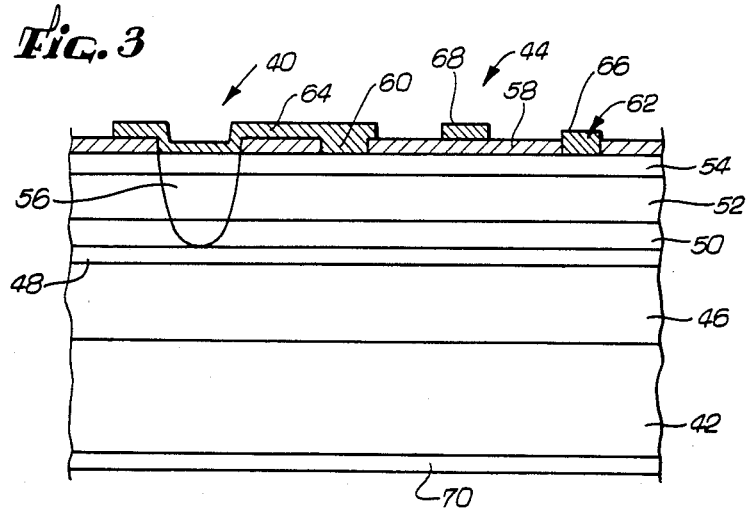
FIG. 3 is a fragmentary cross-sectional view of a second embodiment of the invention.

FIG. 3 shows a second embodiment of the invention, in which a semiconductor laser 40 is combined on a heavily doped substrate 42 with a MISFET 44 operated in the depletion mode. In the depletion mode, an FET is conductive with zero bias voltage supplied to its gate, and a voltage must be applied to deplete the carriers in the FET channel and thereby reduce or terminate the flow of current through the device.

As in the first-described embodiment, the substrate 42 is of n+ indium phosphide (InP) with a doping concentration of approximately $1 \times 10^{18}$ cm$^{-3}$, and has formed on it a buffer layer 46 of the same material and about four microns thickness. Above this layer, as before, is a thin layer 48 forming the active region for the laser 40. This active layer 48 is, in the second illustrative embodiment, approximately 0.1 micron thick and of undoped InGaAsP, having a p-type doping concentration of approximately $1 \times 10^{17}$ cm$^{-3}$. Above the active layer 48, however, the structure is different from the first-described embodiment. Above the active layer 48 is first a layer 50 of undoped indium phosphide (InP), having an n-type concentration of approximately $1 \times 10^{16}$ cm$^{-3}$, then a semi-insulating layer 52 of InP, which is preferably purified to a concentration of less than $1 \times 10^{16}$ cm$^{-3}$ and doped with a deep level dopant such as cobalt. An example of a process for producing such a semi-insulating layer is provided in a copending and commonly-assigned U.S. patent application Ser. No. 506,683 filed 6-22-83, filed in the names of Edward A. Rezek et al. and entitled "Liquid Phase Epitaxial Growth Process," which is incorporated by reference. The two layers 50 and 52 total about three microns in thickness. Above the semi-insulating layer 52 is an n-type layer 54 of InGaAs or InP, forming the active layer for the MISFET 44. It has a thickness of approximately 0.3 micron and an n-type concentration of approximately $8 \times 10^{16}$ cm$^{-3}$.

As in the first described embodiment, there is a zinc diffusion region 56 extending down to the laser active layer 48 and having a p+ concentration of approximately $1 \times 10^{18}$ cm$^{-3}$. A silicon dioxide layer 58 covers the n-type layer 54 except for appropriate openings over the zinc diffusion region 56 and over source and drain regions 60 and 62 formed above the n-type layer. A source metalization layer 64 makes contact with the source region 60 and also serves as an ohmic contact with the zinc diffusion region 56. A drain metalization layer 66 forms a contact with the drain region 62, and a gate contact 68 is positioned between the source and the drain. Finally, there is a substrate contact layer 70 on the underside of the substrate 42.

Figure 4:
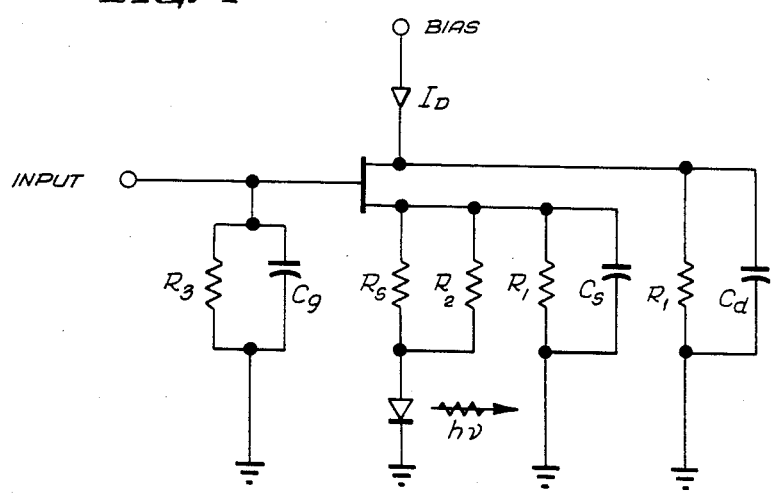
FIG. 4 is a schematic diagram showing the equivalent circuit of the device of FIG. 3.

As shown in FIG. 4, the equivalent circuit of the FIG. 3 embodiment is similar in some respects to that of the FIG. 1 embodiment. The following symbols are used in FIG. 4:

$R_1$=bypass resistance from source or drain to ground, through semi-insulating layers,
$R_2$=resistance between source and laser through semi-insulating layer,
$R_3$=gate resistance (to ground),
$R_s$=laser series resistance,
$C_g$=gate capacitance (to ground),
$C_s$=source capacitance (to ground),
$C_d$=drain capacitance (to ground), It will be observed from FIG. 4 that the source and drain terminals each have a path to ground through $R_1$ and through their respective capacitances $C_s$ and $C_d$. Also there is a similar path to ground from the gate through resistance $R_g$ and capacitance $C_g$. The principal current flow path is through the MISFET to the laser, through series resistance $R_s$ and the laser shown as a diode. There is a leakage path through parallel resistance $R_2$ to the laser. Since the resistivity of the semi-insulating layer 52 and the undoped layer 50 is relatively high, the values of $R^1$ and $R^2$ will be high and the leakage paths through $R_1$, $R_2$ and $C_g$ will be kept to an insignificant level.

For the materials, doping concentrations and dimensions as described, and for a channel width of 200 microns and channel length of five microns, the channel resistance in the "on" state of the device is approximately 30 ohms. Approximately 150 mA can be delivered to the laser if a bias voltage of 5 v is employed.

Figure 5:
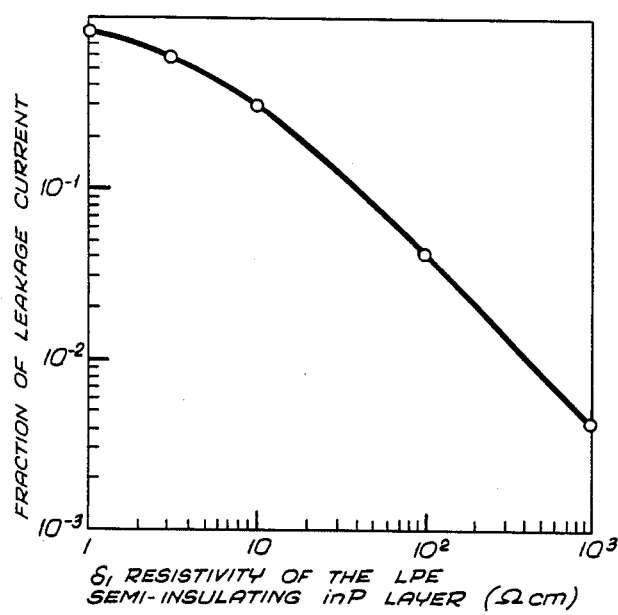
FIG. 5 is a graph showing the relationship between leakage current and the resistivity of the semi-insulating layer in the device of FIG. 3.

The graph in FIG. 5 shows the variation of leakage current with the resistivity of the semi-insulating layer 52. The resistivity is plotted along the x axis in ohm-cm and the leakage is plotted along the y axis as a fraction of the total current.

Figure 6:
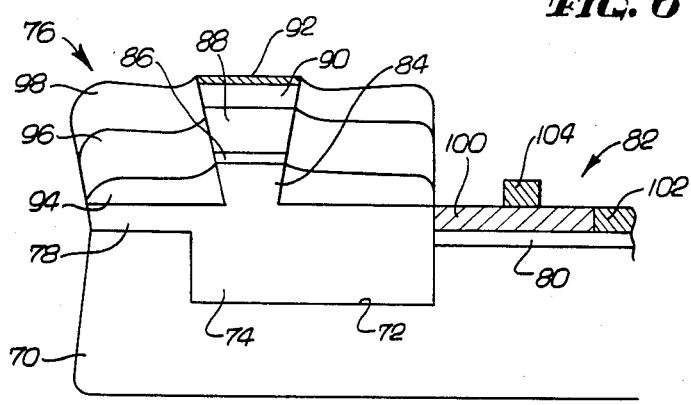
FIG. 6 is a fragmentary cross-sectional view of a third embodiment of the invention.

The third embodiment of the invention, shown in FIG. 6, differs from the other two in that it is fabricated on a semi-insulating substrate 70 of indium phosphide (InP). A first step in the fabrication process is to etch away a relatively deep well, indicated at 72, in the substrate 70. This is to accomodate an n+ InP region 74 of a laser 76 to be formed on the device. Apart from the well 72, the laser 76 is a conventional buried heterostructure semiconductor laser. The n+ InP region 74 extends over the edge of the well 72 in one direction, as shown at 78, and in the other direction to form a depletion-mode channel 80 for a MISFET 82. This channel can also be formed by other processes such as ion implantation or diffusion. The n+ InP region 74 is also formed into a small mesa 84 about the three microns in length, on top of which is formed a thin undoped layer 86 of InGaAsP, the active layer for the laser 76. On top of the active layer 86 is a p-type layer 88 of InP. Then there is a p+ layer 90 of InGaAsP serving as an ohmic contact region for the laser 76, and on top of this there is a metalization layer 92. The laser structure, including the mesa 84 and layers 86, 88, 90 and 92, is tapered from a greater length at the uppermost layers to a smaller length at the n+ mesa at the bottom. The mesa 84 and the layer 88 must be of opposite conductivity types, but n-type material is preferred for the mesa 84.

Completing the laser structure are three optical cladding layers 94, 96 and 98 laterally surrounding the n+ mesa 84 and the layers 86, 88 and 90. Cladding layer 94 is formed over the n+ region 74 and its extension 78, and is of p-type InP. Cladding layer 96 is formed over cladding layer 94 and is of n-type InP, and cladding layer 98 is formed over cladding layer 96, and is of p-type InP. The junction between cladding layers 94 and 96 will be reverse-biased during operation of the device, and this reverse bias will minimize the flow of leakage current through the cladding layers, so that practically all current through the laser will be usefully employed in lasing action in the active layer 86.

The MISFET 82 further includes an insulating layer 100 of silicon dioxide, formed over the channel 80, a drain region 102 formed in an opening in the insulating layer, and a gate terminal 104 formed over the insulating layer between the drain and the laser structure. The n+ InP region 74 in the well 72 serves not only as one element of the laser 76, but also as a source region for the MISFET 82. The MISFET 82 operates in the depletion mode, i.e., the channel 80 is conductive with zero gate bias and must be depleted of current carriers to reduce or terminate the current flow.

Figure 7:
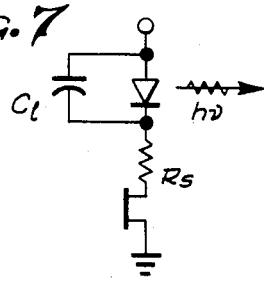
FIG. 7 is a schematic diagram showing the equivalent circuit of the device of FIG. 6.

As shown in the equivalent circuit of FIG. 7, the MISFET source is effectively coupled to a series resistance $R_s$ between the source and the laser. This is the series resistance of the laser, and it is minimized by the presence of the well 72, which provides a current path of relatively large cross-sectional area.

The laser 76 also has an inherent capacitance, shown at $C_1$, due principally to the presence of the cladding layers 94, 96 and 98. The graph of FIG. shows how the leakage current through these cladding layers increases with the operating frequency of the device. For operation at higher frequencies, the capacitance $C_1$ may have to be reduced by etching away some of the excess cladding material.

Figure 9:
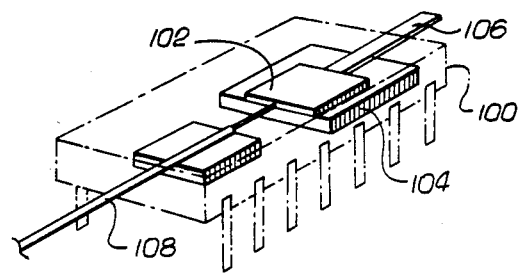
FIG. 9 is a simplified perspective view of a device package embodying the novel combination of the invention.
Figure 8:
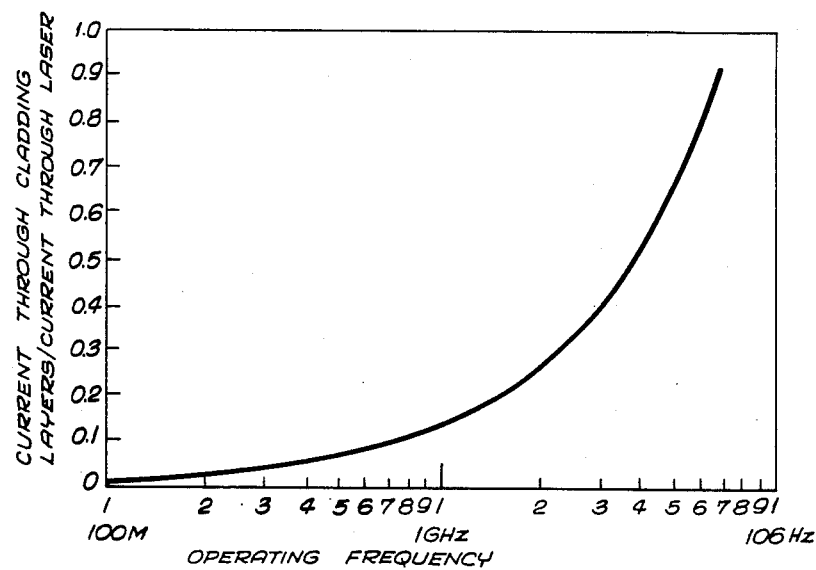
FIG. 8 is a graph showing the relationship between leakage current through the cladding layers of the FIG. 6 device, and the operating frequency of the device.

FIG. 9 shows a package in which any of the described embodiments may be housed. The package takes the form of a standard 14-pin integrated-circuit package 100, in which an integrated MOSFET and a semiconductor laser chip 102 is disposed on a support 104. The chip 102 is connected to a high-speed signal stripline 106 for the input of a bias signal to the MISFET, and has an outer fiber 108 into which light from the semiconductor laser is launched.

It will be appreciated from the foregoing that the present invention represents a significant advance in the field of integrated optics. In particular, the invention facilitates the integration of semiconductor lasers with easily reproducible MISFET devices. It will also be appreciated that, although specific embodiments of the invention have been described in detail by way of illustration, various modifications may be made without departing from the spirit and scope of the invention. Accordingly, the invention is not to be limited except as by the appended claims.

We claim:

1. A monolithic laser and electronic device, comprising:
   a substrate;
   a semiconductor laser formed on said substrate; and a metal-insulator-semiconductor field-effect transistor (MISFET) also formed on said substrate and having one electrical terminal in common with a terminal of said semiconductor laser; wherein said substrate is of a Group III-V compound heavily doped with an impurity of a particular polarity type;

said device further includes a laser active layer of a Group III-V compound formed on said substrate, and a MISFET channel region of a Group III-V compound formed over said laser active layer and doped with an impurity of the opposite polarity of said substrate;

said semiconductor laser includes a diffused region formed in said MISFET channel region by selective diffusion of a material of the same polarity type as said laser active layer, and an ohmic contact region formed over said diffused region; and said MISFET includes source and drain regions formed over said MISFET active layer, one of said source and drain regions being electrically connected to said ohmic contact region of said semiconductor laser, and an insulated gate terminal disposed between said source and drain regions;

and wherein said MISFET is operated in an inversion mode;

and wherein said semiconductor laser is disposed at least in part below the level of the MISFET, thereby facilitating the use of planar fabrication techniques.

2. A monolithic device as set forth in claim 1, and further including:

an integrated-circuit package housing;

support means within said housing for supporting said substrate; and fiber-optic output means supported in said housing.

3. A monolithic laser and electronic device, comprising:

a substrate;

a semiconductor laser formed on said substrate; and a metal-insulator-semiconductor field-effect transistor (MISFET) also formed on said substrate and having one electrical terminal in common with a terminal of said semiconductor laser; wherein said substrate is of a Group III-V compound and is heavily doped with an impurity of a particular polarity type;

said device further includes a laser active layer of a Group III-V compound formed on said substrate, a MISFET channel region of a Group III-V compound formed over said laser active layer and doped with an impurity of the opposite polarity of said substrate, and a semi-insulating layer formed beneath said MISFET channel region, to confine current carrier flow in said MISFET channel region to a relatively shallow portion of said MISFET channel region;

said semiconductor laser includes a diffused region extending down to said laser active layer and formed by selective diffusion of a material of the same polarity type as said laser active layer, and an ohmic contact region formed over said diffused region; and said MISFET includes source and drain regions formed over said MISFET channel region, one of said source and drain regions being electrically connected to said ohmic contact region of said semiconductor laser, and an insulated gate terminal disposed between said source and drain regions;

and wherein said MISFET is operated in an inversion mode;

and wherein said semiconductor laser is disposed at least in part below the level of the MISFET, thereby facilitating the use of planar fabrication techniques.

4. A monolithic device as set forth in claim 3, and further including:

an integrated-circuit package housing;

support means within said housing for supporting said substrate; and fiber-optic output means supported in said housing.

5. A monolithic laser and electronic device, comprising:

a substrate;

a semiconductor laser formed on said substrate; and a metal-insulator-semiconductor field-effect transistor (MISFET) also formed on said substrate and having one electrical terminal in common with a terminal of said semiconductor laser; wherein said substrate is of a semi-insulating compound of elements selected from Groups III-V of the periodic table;

said semiconductor laser is of the buried heterostructure type and includes a first region of a Group III-V compound heavily doped with impurities of a selected polarity and disposed in a well previously formed in said substrate, a second, undoped region formed over said first region and serving as an active layer for said laser, a third region formed over said second region and being heavily doped with an impurity of the opposite polarity to said first region, a plurality of cladding layers laterally surrounding said second and third regions and a portion of said first region, and an ohmic contact region formed over said third region; and said MISFET is operated in the depletion mode and includes a MISFET channel region formed over said substrate adjacent to said first region of said semiconductor laser, a drain region formed over said MISFET channel region, and an insulated gate terminal disposed between said drain region and said first region of said semiconductor laser, which also serves as a source region for said MISFET;

whereby said first region of said semiconductor laser, because of its relatively deep geometry, provides the laser with a relatively low series resistance;

and wherein said semiconductor laser is disposed at least in part below the level of the MISFET, thereby facilitating the use of planar fabrication techniques.

6. A monolithic device as set forth in claim 5, and further including:

an integrated-circuit package housing;

support means within said housing for supporting said substrate; and fiber-optic output means supported in said housing.

7. A monolithic laser and electronic device, comprising:

a substrate of a Group III-V compound heavily doped with an impurity of a particular polarity type;

an undoped layer of a group III-V compound formed over said substrate;

a MISFET channel region formed over said undoped layer and having the opposite doping polarity of that of said substrate;

a diffusion region extending down into said MISFET channel region to said undoped layer and having the same polarity of doping as that of said undoped layer;

an ohmic contact region over said diffusion region, whereby said diffusion region, said undoped layer and said substrate form a semiconductor laser, of which the undoped layer is the active region forming part of an optical cavity in which lasing takes place, the substrate and the channel region perform an optical cladding function and the ohmic contact region forms an electrode of the laser;

source and drain regions formed above said MISFET channel region;

an insulating layer formed over said MISFET channel region and having openings for said ohmic contact region of the laser and for said source and drain regions;

a gate terminal disposed above said insulating layer between said source and drain regions;

a source metalization layer connecting said source region and said ohmic contact region of the laser;

a drain metalization layer making contact with said drain region; and an ohmic contact layer located beneath said substrate; and wherein said source and drain regions, said gate terminal and said MISFET active layer together comprise a MISFET that is operated in the inversion mode to supply current to the laser.

8. A monolithic device as set forth in claim 7, wherein:
said substrate is of n+ indium phosphide (InP);
said undoped layer is of indium gallium arsenide phosphide (InGaAsP);
said MISFET channel region is of p-type indium phosphide (InP); and
said diffusion region is formed by the selective diffusion of zinc.

9. A monolithic device as set forth in claim 8, and further including a buffer layer of n+ indium phosphide (InP) disposed between said substrate and said undoped layer.

10. A monolithic device as set forth in claim 7, and further including a buffer layer of the same material as said substrate disposed between said substrate and said undoped layer.

11. A monolithic laser and electronic device, comprising:
a substrate of a Group III-V compound heavily doped with an impurity of a particular polarity type;
an undoped layer of a group III-V compound formed over said substrate;
a semi-insulating layer of a Group III-V compound formed over said undoped layer;
a MISFET channel region formed over said semi-insulating layer;
a diffusion region extending down into said MISFET channel region and through said semi-insulating layer to said undoped layer, and having the same polarity of doping as that of said undoped layer;
an ohmic contact region over said diffusion region, whereby said diffusion region, said undoped layer and said substrate form a semiconductor laser, of which the undoped layer is the active region forming part of an optical cavity in which lasing takes place, the substrate and the channel region perform an optical cladding function and the ohmic contact region forms an electrode of the laser;

source and drain regions formed above said MISFET active layer;

an insulating layer formed over said MISFET channel region and having openings for said ohmic contact region of the laser and for said source and drain regions;

a gate terminal disposed above said insulating layer between said source and drain regions;

a source metalization layer connecting said source region and said ohmic contact region of the laser;

a drain metalization layer making contact with said drain region; and an ohmic contact layer located beneath said substrate;

and wherein said source and drain regions, said gate terminal and said MISFET channel region together comprise a MISFET that is operated in the depletion mode to supply current to the laser, said semi-insulating layer being effective to confine the flow of current to the MISFET active layer.

12. A monolithic device as set forth in claim 11, wherein:
said substrate is of n+ indium phosphide (InP);
said undoped layer is of indium gallium arsenide phosphide (InGaAsP);
said semi-insulating layer is indium phosphide (InP); and
said diffusion region is formed by the selective diffusion of zinc.

13. A monolithic device as set forth in claim 12, wherein:
said MISFET active layer is n-type indium gallium arsenide phosphide (InGaAsP).

14. A monolithic device as set forth in claim 12, wherein:
said MISFET active layer is n-type indium phosphide (InP).

15. A monolithic device as set forth in claim 12, wherein:
said semi-insulating layer includes an irondoped layer of indium phosphide (InP).

16. A monolithic device as set forth in claim 12, wherein:
said semi-insulating layer includes a layer of undoped indium phosphide (InP).

17. A monolithic device as set forth in claim 12, and further including a buffer layer of n+ indium phosphide (InP) disposed between said substrate and said undoped layer.

18. A monolithic device as set forth in claim 11, and further including a buffer layer of the same material as said substrate disposed between said substrate and said undoped layer.

19. A monolithic laser and electronic device, comprising:
a semi-insulating substrate of a Group III-V compound having a well formed in its upper surface;
a buried heterostructure semiconductor laser formed on said substrate and including
a first region of a Group III-V compound disposed in said well and heavily doped with an impurity of a selected polarity,
a second, active region formed over said first region, a third region formed over said second region and doped with an impurity of the opposite polarity to said first region, an ohmic contact region formed on said third region, and a plurality of optical cladding layers laterally surrounding first, second, third and ohmic contact regions of said laser;

a MISFET channel layer formed on said substrate and contiguous with said first region of said laser;

an insulating layer over said channel layer;

a drain region formed over said channel layer at an opening in said insulating layer; and a gate terminal disposed over said insulating layer between said drain region and said laser;

and wherein said first region of said laser also serves as a source region of a MISFET, which is operated in the depletion mode to provide current to said laser.

20. A monolithic device as set forth in claim 19, wherein:

said substrate is of indium phosphide (InP);

said first region of said laser is of n+ indium phosphide (InP);

said second region of said laser is of undoped indium gallium arsenide phosphide (InGaAsP);

said third region of said laser is of p-type indium phosphide (InP); and said cladding layers of said laser are of indium phosphide (InP).

21. A monolithic device as set forth in claim 20, wherein:

said cladding layers include two that form a reverse-biased p-n junction to practically eliminate leakage of current through said cladding layers.

22. A monolithic device as set forth in claim 21, wherein:

said cladding layers include a first p-type layer formed next to said first region of said laser, an n-type layer formed over the p-type cladding layer, and a second p-type layer formed over the n-type cladding layer, and wherein the application of a positive voltage to said ohmic contact region reverse biases the junction between said first p-type cladding layer and said n-type cladding layer.

* * * * *